(12) United States Patent
Sato et al.

(10) Patent No.: US 11,211,280 B2
(45) Date of Patent: Dec. 28, 2021

(54) SUBSTRATE SUPPORT AND SUBSTRATE PROCESSING APPARATUS

(71) Applicant: Kokusai Electric Corporation, Tokyo (JP)

(72) Inventors: Takayuki Sato, Toyama (JP); Naoya Matsuura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 336 days.

(21) Appl. No.: 16/117,328

(22) Filed: Aug. 30, 2018

(65) Prior Publication Data

US 2018/0374740 A1 Dec. 27, 2018

Related U.S. Application Data

(63) Continuation of application No. PCT/JP2016/059675, filed on Mar. 25, 2016.

(51) Int. Cl.
*H01L 21/687* (2006.01)
*H01L 21/67* (2006.01)
*H01J 37/32* (2006.01)

(52) U.S. Cl.
CPC .. *H01L 21/68757* (2013.01); *H01J 37/32724* (2013.01); *H01L 21/67103* (2013.01); *H01L 21/67115* (2013.01); *H01L 21/68785* (2013.01); *H01J 37/3211* (2013.01); *H01J 37/3244* (2013.01); *H01J 2237/24564* (2013.01); *H01L 21/67017* (2013.01); *H01L 21/68742* (2013.01)

(58) Field of Classification Search
CPC ........ H01J 2237/24564; H01J 37/3211; H01J 37/3244; H01J 37/32724; H01L 21/67017; H01L 21/67103; H01L 21/67115; H01L 21/68742; H01L 21/68757; H01L 21/68785
USPC ........................................................ 219/650
See application file for complete search history.

(56) References Cited

U.S. PATENT DOCUMENTS

2006/0151117 A1* 7/2006 Kasanami ......... H01J 37/32082
156/345.52
2007/0046307 A1 3/2007 Itakura et al.
(Continued)

FOREIGN PATENT DOCUMENTS

JP 2007-42958 A 2/2007
JP 2007-258585 A 10/2007
(Continued)

*Primary Examiner* — Dana Ross
*Assistant Examiner* — Joseph W Iskra
(74) *Attorney, Agent, or Firm* — Edell, Shapiro & Finnan, LLC

(57) ABSTRACT

Described herein is a technique capable of preventing a susceptor made of quartz from being damaged by contacting a reflector deformed by thermal expansion. A substrate support according to the technique may include an upper susceptor made of quartz; a lower susceptor made of quartz; and a reflector reflecting heat and made of a metal in a planar shape. A lower surface of the upper susceptor is bonded with an upper surface of the lower susceptor such that the reflector is interposed therebetween, a first recess accommodating the reflector is provided at the upper surface of the lower susceptor, and a portion of the lower surface of the upper susceptor facing the first recess is roughened.

16 Claims, 6 Drawing Sheets

(56) References Cited

U.S. PATENT DOCUMENTS

2008/0066682 A1    3/2008  Yamashita
2010/0055351 A1*  3/2010  Kato ................. C23C 16/45563
                                                                         427/595

FOREIGN PATENT DOCUMENTS

JP         2011-119326 A    6/2011
WO       2004095560 A1  11/2004

* cited by examiner

SUBSTRATE SUPPORT AND SUBSTRATE PROCESSING APPARATUS

CROSS REFERENCE TO RELATED APPLICATIONS

This application is a continuation of International Application No. PCT/JP2016/059675, filed on Mar. 25, 2016, the entire contents of which are hereby incorporated by reference.

TECHNICAL FIELD

The present disclosure relates to a substrate support and a substrate processing apparatus.

BACKGROUND

In a manufacturing process of a semiconductor device, for example, a wafer (hereinafter, also referred to as a "substrate") is heated and a desired process is performed on the heated wafer by a substrate processing apparatus. In order to heat the wafer, for example, a heater provided in a substrate support (susceptor) of the substrate processing apparatus is used. However, when the wafer is heated by the heater provided in the susceptor, the temperature of a surface of the susceptor on which wafer is placed may be unstable. Thus, the wafer placed on the susceptor may not be uniformly heated or the heat radiated from the heater leaks to an outer periphery or a lower side of the susceptor. Therefore, heating of the wafer may not be performed efficiently.

In order to address the above-described problems, for example, the semiconductor manufacturing apparatus and the susceptor may include a reflector configured to reflect the radiant heat from the heater. The reflector is disposed under the heater. It is possible to reduce power consumptions of the heater by the reflector.

However, when the susceptor includes the reflector under the heater, the reflector deformed by thermal expansion may contact the susceptor made of quartz. Thus, the susceptor may be damaged by the adhesion between the reflector and the susceptor.

SUMMARY

Described herein is a technique capable of preventing the susceptor made of quartz from being damaged by contacting the reflector deformed by thermal expansion.

According to one aspect of the technique described herein, there is provided a substrate support including: an upper susceptor made of quartz; a lower susceptor made of quartz; and a reflector reflecting heat and made of a metal in a planar shape, wherein a lower surface of the upper susceptor is bonded with an upper surface of the lower susceptor such that the reflector is interposed therebetween, a first recess accommodating the reflector is provided at the upper surface of the lower susceptor, and a portion of the lower surface of the upper susceptor facing the first recess is roughened.

BRIEF DESCRIPTION OF THE DRAWINGS

FIG. 4A schematically illustrates a state of the reflector during a thermocompression bonding process and FIG. 4B schematically illustrates a state of the reflector cooled after the thermocompression bonding process.

FIG. 7A schematically illustrates a state of the reflector during the thermocompression bonding process and FIG. 7B schematically illustrates a state of the reflector cooled after the thermocompression bonding process FIG. 8 schematically illustrates a vertical cross-section of a susceptor of the substrate processing apparatus according to a second embodiment described herein.

DETAILED DESCRIPTION

Hereinafter, a preferred embodiment (first embodiment) will be described with reference to the drawings.

(1) Configuration of Substrate Processing Apparatus

Hereafter, a substrate processing apparatus according to the first embodiment will be described. The substrate processing apparatus is an example of a semiconductor manufacturing apparatus used for manufacturing a semiconductor device.

Figure 1:
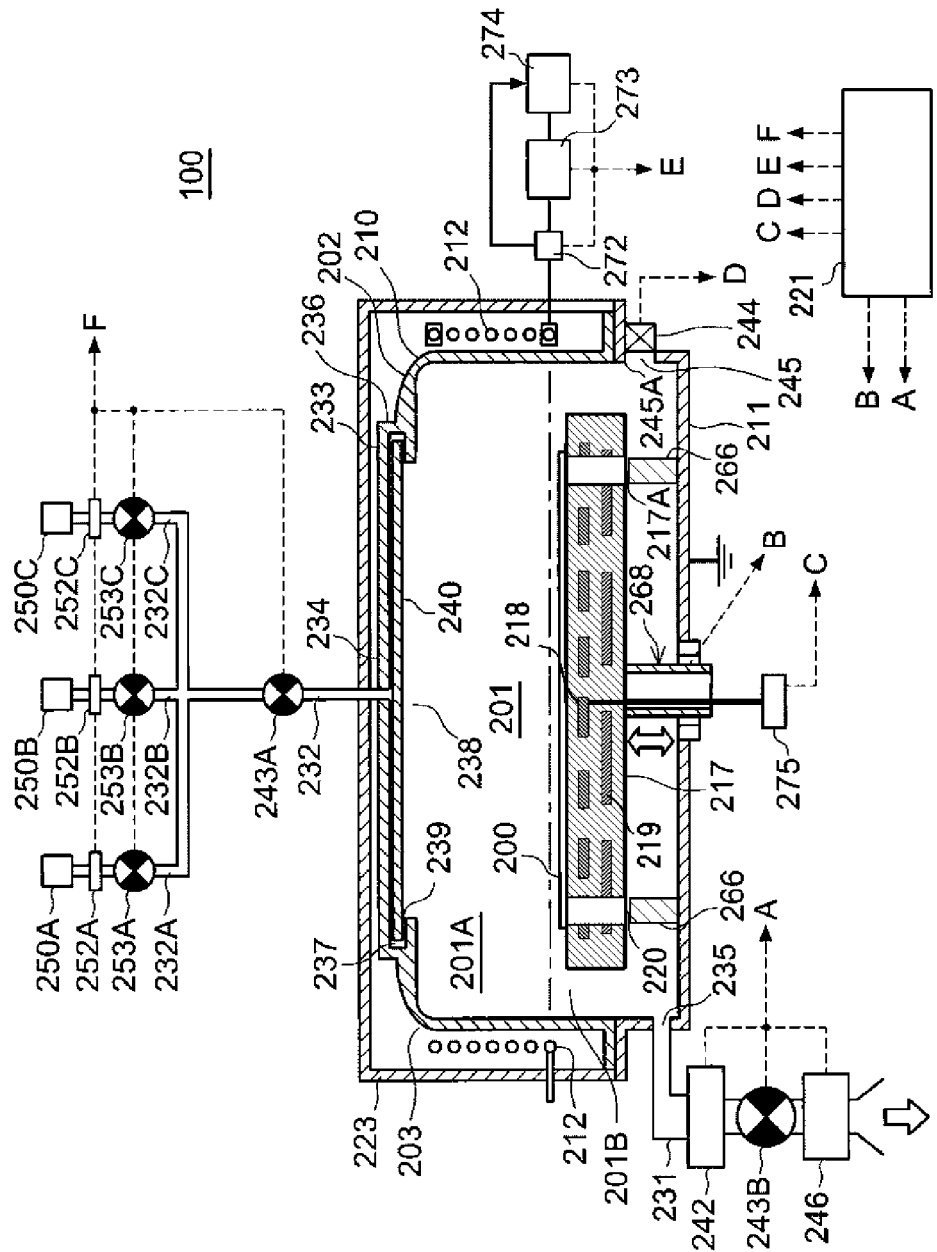
FIG. 1 schematically illustrates a vertical cross-section of a substrate processing apparatus according to a first embodiment described herein.

In the following description, as an example of the substrate processing apparatus according to the first embodiment, an apparatus configured to perform a process such as a film-forming process to a substrate will be described. FIG. 1 schematically illustrates a vertical cross-section of a substrate processing apparatus 100 according to the first embodiment described herein.

The substrate processing apparatus 100 includes a process furnace 202 where a wafer 200 is processed by plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. The upper vessel 210 is made of, for example, a non-metallic material such as aluminum oxide ($Al_2O_3$) and quartz ($SiO_2$), and the lower vessel 211 is made of, for example, aluminum (Al).

A gate valve 244 is provided on a lower side wall of the lower vessel 211. While the gate valve 244 is open, the wafer 200 can be loaded into the process chamber 201 through a substrate loading/unloading port 245 using a transfer mechanism (not shown) or unloaded out of the process chamber 201 through the substrate loading/unloading port 245 using the transfer mechanism (not shown). While the gate valve 244 is closed, the gate valve 244 maintains the process chamber 201 airtight.

As described later, the process chamber 201 includes a plasma generation space 201A that a resonance coil 212 described later is provided therearound and a substrate processing space 201B where the wafer 200 is processed. The substrate processing space 201B communicates with the plasma generation space 201A. The plasma generation space 201A refers to a space where the plasma is generated, for example, a space above a lower end of the resonance coil 212 (indicated by a dashed line in FIG. 1) in the process chamber 201. The substrate processing space 201B refers to a space where the wafer 200 is processed by plasma, for example, a space below the lower end of the resonance coil 212.

Susceptor

A susceptor 217 serving as a substrate support (substrate placement part) is provided at a center of a bottom portion of the process chamber 201. The wafer 200 can be placed on the susceptor 217. The susceptor 217 includes a heater 218 and a reflector 219 serving as a reflection part. The susceptor 217 is made of a non-metallic material. According to the first embodiment, the susceptor 217 is made of quartz. A susceptor cover (not shown) configured to uniformly transfer the heat from the susceptor 217 (that is, the heater 218) to the wafer 200 may be provided between the susceptor 217 and the wafer 200. The susceptor cover is made of a non-metallic material such as aluminum nitride (AlN), ceramics, quartz and silicon carbide (SiC).

The heater 218 serving as a heating mechanism is integrally embedded in the susceptor 217. The heater 218 is constituted by a resistance heating type heating element (also referred to as a "heater element"). For example, the heater element is made of a material such as SiC, carbon, nickel and glassy carbon. Electric power is supplied from a heater power supply 275 to the heater 218 via a feed line. When the electric power is supplied, the heater 218 is configured to heat the wafer 200 such that a surface temperature of the wafer 200 may range, for example, from 25° C. to 700° C.

The reflector 219 in a planar shape is provided in the susceptor 217 under the heater 218. The reflector 219 reflects radiant heat radiated from the heater 218 toward the wafer 200. As a result, the wafer 200 is efficiently heated. The reflector 219 is made of a material having high reflectance in order to efficiently reflect the radiant heat radiated from the heater 218. For the reflector 219, such material that has a constant reflectance and is chemically stable at high temperature is needed. Thus, for example, metal with high melting point such as molybdenum (Mo), tungsten (W), nickel (Ni), platinum (Pt), palladium (Pd), platinum-rhodium alloy and gold (Au) is used for the reflector 219. In addition to above-described metal, a material such as carbon and SiC may be used for the reflector 219. However, the first embodiment is preferably applied when a material with a high thermal expansion coefficient or having the property of adhering to quartz under high temperature (for example, the above-described metal) is used for the reflector 219.

A susceptor elevating mechanism 268 configured to elevate and lower the susceptor 217 is provided at the susceptor 217. Wafer lift pins 266 are provided at the bottom of the lower vessel 211. Holes 220 wherethrough the wafer lift pins 266 penetrate are provided in the susceptor 217 corresponding to the wafer lift pins 266. The holes 220 and the wafer lift pins 266 are provided at least three positions facing each other. When the susceptor 217 is lowered by the susceptor elevating mechanism 268, the wafer lift pins 266 pass through the holes 220 without contacting the susceptor 217.

The susceptor 217, the heater 218 and the reflector 219 of the first embodiment will be described later in detail.

Gas Supply System

A shower head 236 is provided above the process chamber 201, that is, on an upper portion of the upper vessel 210. The shower head 236 includes a cap-shaped lid 233, a gas inlet port 234, a buffer chamber 237, an opening portion 238, a shield plate 240 and a gas outlet port 239. The shower head 236 is configured to supply a reactive gas into the process chamber 201. The buffer chamber 237 functions as a dispersion space for dispersing the reactive gas supplied through the gas inlet port 234.

A downstream end of a oxygen-containing gas supply pipe 232A configured to supply an oxygen ($O_2$) gas serving as a oxygen-containing gas, a downstream end of a hydrogen-containing supply pipe 232B configured to supply a hydrogen ($H_2$) gas serving as a hydrogen-containing gas and a downstream end of an inert gas supply pipe 232C configured to supply an argon (Ar) gas serving as an inert gas are connected to join the gas inlet port 234. An oxygen gas supply source 250A, a mass flow controller (MFC) 252A serving as a flow rate controller (flow rate control mechanism) and a valve 253A serving as an opening/closing valve are provided in order from the upstream side to the downstream side of the oxygen-containing gas supply pipe 232A. A hydrogen gas supply source 250B, a mass flow controller (MFC) 252B serving as a flow rate controller (flow rate control mechanism) and a valve 253B serving as an opening/closing valve are provided in order from the upstream side to the downstream side of the hydrogen-containing supply pipe 232B. An argon gas supply source 250C, a mass flow controller (MFC) 252C serving as a flow rate controller (flow rate control mechanism) and a valve 253C serving as an opening/closing valve are provided in order from the upstream side to the downstream side of the inert gas supply pipe 232C. A valve 243A is provided on the downstream side whereat the oxygen-containing gas supply pipe 232A joins the hydrogen-containing supply pipe 232B and the inert gas supply pipe 232C. That is, the valve 243A is provided at a gas supply pipe 232 shown in FIG. 1. The valve 243A is connected to the upstream end of the gas inlet port 234. Reactive gases such as the oxygen-containing gas, the hydrogen-containing gas and the inert gas can be supplied into the process chamber 201 via the gas supply pipes 232A, 232B, 232C and 232 by opening and closing the valves 253A, 253B, 253C and 243A while adjusting the flow rates of the respective gases by the MFCs 252A, 252B and 252C.

Exhaust System

A gas exhaust port 235 is provided on the side wall of the lower vessel 211. The gas such as the reactive gases is exhausted from the process chamber 201 through the gas exhaust port 235. An upstream end of a gas exhaust pipe 231 is connected to the gas exhaust port 235. An APC (Automatic Pressure Controller) 242 serving as a pressure controller (pressure adjusting mechanism), a valve 243B serving as an opening/closing valve and a vacuum pump 246 serving as a vacuum exhaust device are provided in order from the upstream side to the downstream side of the gas exhaust pipe 231.

Plasma Generator

A helical resonance coil 212 is provided so as to surround the process chamber 201 at the outer periphery of the process chamber 201, that is, on the outer side of the side wall of the upper vessel 210. An RF sensor 272, a high frequency power supply 273 and a frequency matching mechanism 274 are connected to the resonance coil 212. The high frequency power supply 273 supplies a high frequency power to the resonance coil 212. The RF sensor 272 is provided at an output side of the high frequency power supply 273. The RF sensor 272 monitors information of the traveling wave or reflected wave of the supplied high frequency power. The frequency matching mechanism 274 controls the high frequency power supply 273 so as to minimize the reflected wave based on information of the reflected wave monitored by the RF sensor 272.

When the high frequency power is applied from the high frequency power supply 273 to the resonance coil 212, a high frequency electric field is generated in the plasma generation space 201A by the resonance coil 212. The gas such as the oxygen gas and the hydrogen gas supplied into the process chamber 201 is excited by the high frequency electric field. The excited gas in the plasma state generates a reactive species such as active species and ions containing the gas element (that is, oxygen or hydrogen).

Controller

A controller 221 is configured to control the APC 242, the valve 243B and the vacuum pump 246 via a signal line A, the susceptor elevating mechanism 268 via a signal line B, the heater 218 via a signal line C, the gate valve 244 via a signal line D, the RF sensor 272, the high frequency power supply 273 and the frequency matching mechanism 274 via a signal line E, and MFCs 252A, 252B and 252C and the valves 253A, 253B, 253C and 243A via a signal line F.

The controller 221 is embodied by a computer operated by a program for controlling each of the above-described components, and the program may be stored in a computer-readable recording medium. For example, the recording medium is electrically connected to the substrate processing apparatus 100, and the controller 221 of the substrate processing apparatus 100 can read the program from the recording medium and control the above-described components.

(2) Substrate Processing

Hereinafter, a substrate processing according to the first embodiment will be described. The substrate processing according to the first embodiment is performed by the above-described substrate processing apparatus 100, as one of the manufacturing processes of the semiconductor device such as a flash memory. In the following description, the components of the substrate processing apparatus 100 are controlled by the controller 221.

Substrate Loading Step

First, the wafer 200 is loaded into the process chamber 201. Specifically, the susceptor 217 is lowered to a position for transferring the wafer 200 ("wafer transfer position") by the susceptor elevating mechanism 268. The wafer lift pins 266 penetrate the holes 220 of the susceptor 217. As a result, the wafer lift pins 266 protrude from the surface of the susceptor 217 by a predetermined height.

Next, the gate valve 244 is opened and the wafer 200 is loaded into the process chamber 201 from a vacuum transfer chamber (not shown) adjacent to the process chamber 201 by the transfer mechanism (not shown). As a result, the wafer 200 is horizontally supported by the wafer lift pins 266 protruding from the surface of the susceptor 217. After the wafer 200 is transferred into the process chamber 201, the transfer mechanism is retracted to the outside of the process chamber 201, and the gate valve 244 is closed to seal the process chamber 201. Thereafter, the susceptor elevating mechanism 268 elevates the susceptor 217 until the wafer 200 is at a predetermined position between the lower end of the resonance coil 212 and an upper end 245A of the substrate loading/unloading port 245. As a result, the wafer 200 is placed on an upper surface of the susceptor 217 and supported by the susceptor 217.

Temperature Elevating and Vacuum Exhaust Step

Next, the temperature of the wafer 200 loaded into the process chamber 201 is elevated. The heater 218 embedded in the susceptor 217 is heated in advance. By placing the wafer 200 on the susceptor 217 where the heater 218 is embedded, the wafer 200 is heated to a predetermined temperature. For example, the predetermined temperature of the wafer 200 ranges from 150° C. to 650° C. While the wafer 200 is being heated, the vacuum pump 246 vacuum-exhausts the inside of the process chamber 201 through the gas exhaust port 235 such that an inner pressure of the process chamber 201 is at a predetermined pressure. For example, the predetermined pressure ranges from 0.1 Pa to 1,000 Pa. The vacuum pump 246 vacuum-exhausts the inside of the process chamber 201 at least until a substrate unloading step described later is completed.

Reactive Gas Supply Step

Next, the oxygen gas serving as the reactive gas is supplied. Specifically, the valve 253A is opened to supply of the oxygen gas into the process chamber 201 via the buffer chamber 237 while the flow rate of the oxygen gas is adjusted by the MFC 252A. In the reactive gas supply step, for example, the amount of the oxygen gas supplied into the process chamber 201 is set within a range from 100 sccm to 1,000 sccm. The inside of the process chamber 201 is exhausted by adjusting the opening degree of the APC 242 such that the inner pressure of the process chamber 201 is at a predetermined pressure ranging from 1 Pa to 1,000 Pa. The oxygen gas is continuously supplied while the inside of the process chamber 201 is properly exhausted until a plasma process step described later is completed.

Plasma Process Step

After the inner pressure of the process chamber 201 is stabilized, the high frequency power is applied to the resonance coil 212 via the frequency matching mechanism 274 from the high frequency power supply 273.

As a result, a high frequency electric field is generated in the plasma generation space 201A, and a donut-shaped induction plasma is excited at a height corresponding to an electric midpoint of the resonance coil 212 in the plasma generation space 201A. The oxygen gas in plasma state is dissociated to generate a reactive species such as an oxygen active species (radicals) including oxygen (O) and ions. The oxygen radicals and ions are uniformly supplied to the surface of the wafer 200 placed on the susceptor 217 in the substrate processing space 201B. The oxygen radicals and ions react with a silicon film on the wafer 200, and the silicon film is modified to a silicon oxide film having high step coverage.

After a predetermined process time elapses, for example, after 10 second to 300 seconds elapse, the output of the electrical power from the high frequency power supply 273 is stopped to stop the plasma discharge in the process chamber 201. The valve 253A is closed to stop the supply of the oxygen gas into the process chamber 201. Thereby, the plasma process step is completed.

Vacuum Exhaust Step

After the predetermined processing time elapses and the supply of the oxygen gas is stopped, in the vacuum exhaust step, the inside of the process chamber 201 is vacuum-exhausted through the gas exhaust port 235. As a result, the gas such as an exhaust gas produced by the reaction of the oxygen gas in the process chamber 201 and the oxygen gas is exhausted to the outside of the process chamber 201. Thereafter, the opening degree of the APC 242 is adjusted such that the inner pressure of the process chamber 201 is adjusted to the same pressure as that of the vacuum transfer chamber (not shown) where the wafer 200 is transferred in a substrate unloading step described below. For example, the process chamber 201 is adjusted to 100 Pa.

Substrate Unloading Step

After the inner pressure of the process chamber 201 reaches a predetermined pressure, the susceptor 217 is lowered to the wafer transfer position described above until the wafer 200 is supported by the wafer lift pins 266. Then, the gate valve 244 is opened and the wafer 200 is unloaded from the process chamber 201 to the outside of the process chamber 201 by the transfer mechanism (not shown). Thereby, the substrate processing according to the first embodiment is completed.

According to the first embodiment, an oxide film (i.e., the silicon oxide film) is formed on the silicon film on the wafer 200 by supplying the oxygen gas into the process chamber 201 and exciting the oxygen gas by plasma to oxidize the silicon film. However, in the first embodiment, the oxygen gas and the hydrogen gas may be supplied into the process chamber 201 together as the gas excited by plasma. When the first embodiment is applied to form a nitride film by nitriding the silicon film instead of forming the oxide film by oxidizing the silicon film, a nitrogen ($N_2$) gas, an ammonia ($NH_3$) gas or both of the nitrogen gas and the ammonia gas are supplied into the process chamber 201 and excited by plasma to nitride the silicon film.

Structure of Susceptor 217

Next, the structure of the susceptor 217, the heater 218 and the reflector 219 according to the first embodiment will be described in comparison with that of the susceptor 217, the heater 218 and the reflector 219 according to a comparative example.

Figure 2:
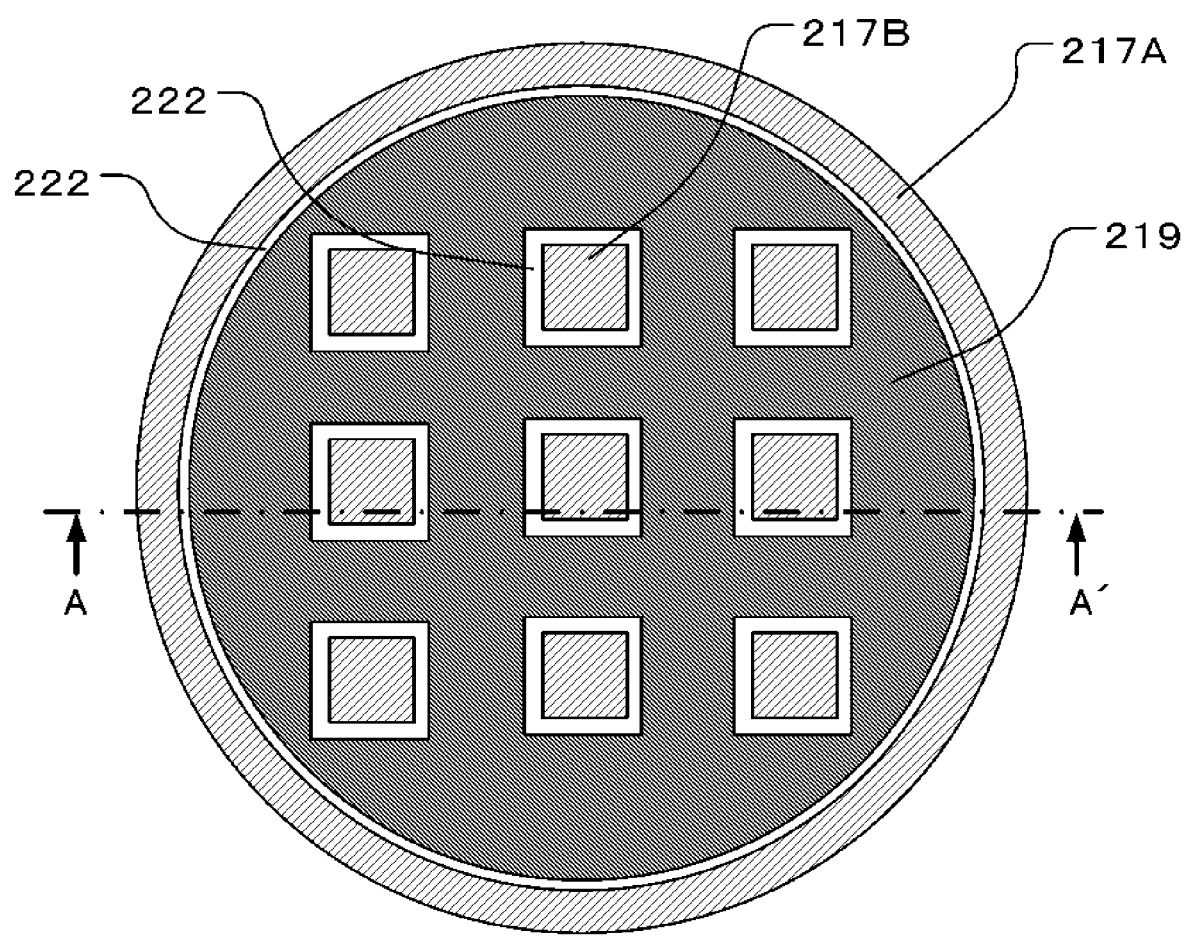
FIG. 2 schematically illustrates a horizontal cross-section of a susceptor of the substrate processing apparatus according to the first embodiment where a reflector is provided.

FIG. 2 schematically illustrates a horizontal cross-section of the susceptor 217 where the reflector 219 is provided. The structure of the susceptor 217 according to the first embodiment and the structure of the susceptor 217 according to the comparative example are the same when viewed from the horizontal cross-section. The reflector 219 is provided so as to be accommodated in a space provided inside the susceptor 217. In order to stably maintain the space accommodating the reflector 219, an outer peripheral portion 217A is provided on an outer periphery of the circular susceptor 217, and a plurality of column portions 217B are provided on an inner side of the circular susceptor 217. In order to prevent the reflector 219 from contacting the outer peripheral portion 217A and the plurality of column portions 217B and from damaging the outer peripheral portion 217A and the plurality of column portions 217B when the reflector 219 is expanded and deformed due to the heat, gaps 222 are provided between the reflector 219 and the outer peripheral portion 217A and between the reflector 219 and the plurality of column portions 217B, respectively.

COMPARATIVE EXAMPLE

Figure 3:
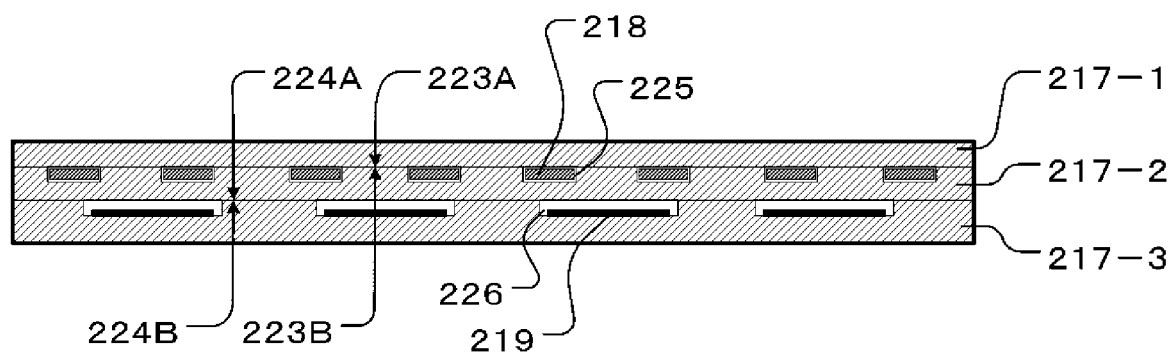
FIG. 3 schematically illustrates a vertical cross-section of a susceptor according to a comparative example.

FIG. 3 schematically illustrates a vertical cross-section of the susceptor 217 with the heater 218 and the reflector 219 embedded therein according to the comparative example. Specifically, FIG. 3 schematically illustrates the vertical cross-section taken along the dot-and-dash line A-A' of the susceptor 217 shown in FIG. 2.

The susceptor 217 is constituted by stacking an upper quartz plate 217-1, a middle quartz plate 217-2 and a lower quartz plate 217-3 in order from the top. The wafer 200 is placed directly on an upper surface of the upper quartz plate 217-1 or via a component such as a susceptor cover (not shown). The upper quartz plate 217-1 and the middle quartz plate 217-2 are bonded by bonding a bonding surface 223A and a bonding surface 223B. The bonding surface 223A is formed on a lower surface of the upper quartz plate 217-1, and the bonding surface 223B is formed on an upper surface of the middle quartz plate 217-2, as shown in FIG. 3. The middle quartz plate 217-2 is bonded with the lower quartz plate 217-3 by bonding a bonding surface 224A with a bonding surface 224 B. The bonding surface 224A is formed on a lower surface of the middle quartz plate 217-2, and the bonding surface 224B is formed on an upper surface of the lower quartz plate 217-3, as shown in FIG. 3. In a positional relationship with the bonding surface 224A and 224B, the upper quartz plate 217-1 and the middle quartz plate 217-2 constitute an upper susceptor, and the lower quartz plate 217-3 constitutes a lower susceptor.

A heater housing portion 225 which is a space where the heater 218 is accommodated is provided at the middle quartz plate 217-2. The heater 218 is sealed between the upper quartz plate 217-1 and the middle quartz plate 217-2 by housing the heater 218 in the heater housing portion 225 and bonding the upper quartz plate 217-1 and the middle quartz plate 217-2. Since the heater 218 is sealed in the susceptor 217, the heater 218 does not contact with the gas in the process chamber 201. According to the first embodiment, for example, the heater housing portion 225 is formed as a groove whose shape corresponds to the shape of the heater 218. However, the shape of the heater housing portion 225 is not limited thereto. For example, the heater housing portion 225 may be formed as a recess of various shapes in the middle quartz plate 217-2 according to the shape of the heating element of the heater 218.

A reflector housing portion 226 which is a space where the reflector 219 is accommodated is provided at the lower quartz plate 217-3. The reflector 219 is sealed between the middle quartz plate 217-2 and the lower quartz plate 217-3 by accommodating the reflector 219 in the reflector housing portion 226 and bonding the middle quartz plate 217-2 and the lower quartz plate 217-3. Since the reflector 219 is sealed in the susceptor 217 in a vacuum state, the reflector 219 does not contact with the gas in the process chamber 201. According to the first embodiment, for example, the reflector housing portion 226 is formed as a recess in the lower quartz plate 217-3 according to the shape of the reflector 219 shown in FIG. 2.

According to the first embodiment, the susceptor 217 has a structure made of quartz and includes components such as the plurality of column portions 217B at the inner side. Thus, it is generally difficult to bond the upper quartz plate 217-1, the middle quartz plate 217-2 and the lower quartz plate 217-3 of the first embodiment using a welding technique for a susceptor made of a metal such as aluminum and stainless steel. Therefore, the quartz plates 217-1, 217-2 and 217-3 are bonded one another using a thermocompression bonding technique (process). The thermocompression bonding process is performed by pressing the bonding surfaces 223A, 223B, 224A and 224B of the quartz plates 217-1, 217-2 and 217-3 with one another at a predetermined pressure for a predetermined time at a high temperature whereat the viscosity of quartz decreases. In order to integrate the quartz of the quartz plates 217-1, 217-2 and 217-3 with one another substantially without a boundary by using the thermocompression bonding process, the flatness of the bonding surfaces 223A, 223B, 224A and 224B is an important factor in addition to the temperature, the pressure and the time described above. Thus, for example, the bonding surfaces 223A, 223B, 224A and 224B are polished into a transparent and flat surface. Specifically, an entire surface of the bonding surface 223A, a surface of the bonding surface 223B excluding the portion where the heater housing portion 225 is provided, an entire surface of the bonding surface 224A and a surface of the bonding surface 224B excluding the portion where the reflector housing portion 226 is provided (that is, portions corresponding to the outer peripheral portion 217A and the plurality of column portions 217B) are processed into a transparent and flat surface. However, when the bonding surfaces 223A, 223B, 224A and 224B are formed and the thermocompression bonding process is performed as in the comparative example, the reflector 219 is expanded and deformed due to the heat to thereby cause the following problems.

Figure 4A:
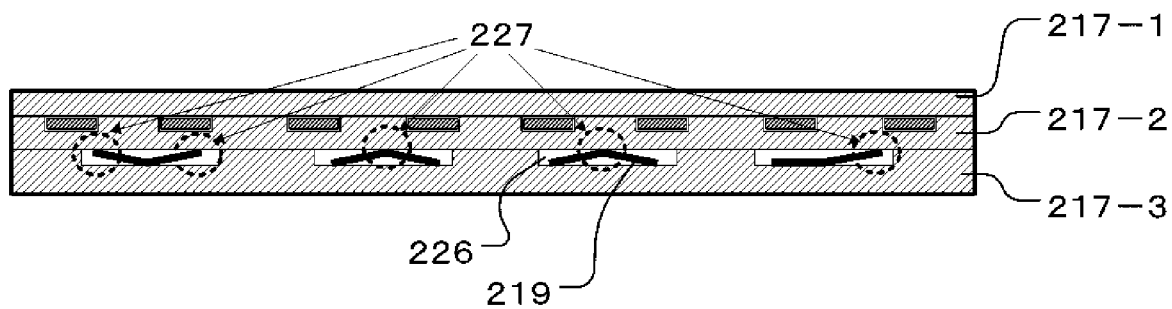
FIGS. 4A and 4B schematically illustrate a vertical cross-section of the susceptor according to the comparative example.
Figure 4B:
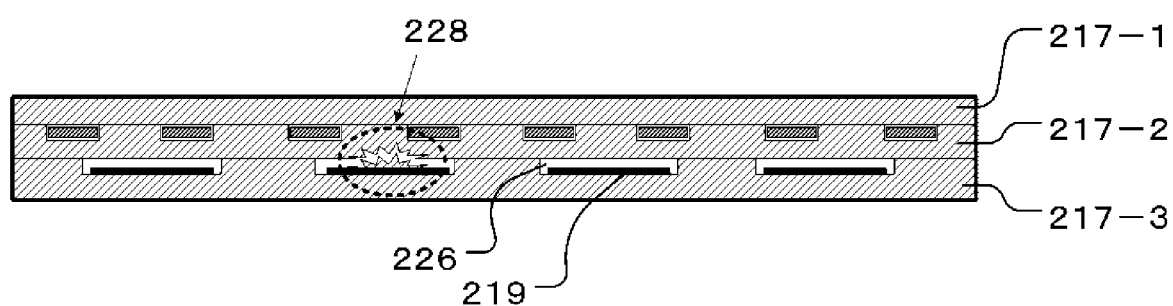

FIGS. 4A and 4B schematically illustrate a vertical cross-section of the susceptor 217 with the heater 218 and the reflector 219 embedded therein according to the comparative example. Specifically, FIG. 4A schematically illustrates a state of the reflector 219 according to the comparative example while performing the thermocompression bonding process. While the thermocompression bonding process is performed, the quartz plates 217-1, 217-2 and 217-3 are heated to a temperature at which the viscosity of the quartz decreases. However, the reflector 219 made of a metal material is also heated, and the metal material causes thermal expansion. It is difficult to heat the planar-shaped reflector 219 in a completely uniform manner. Thus, the reflector 219 is deformed by a difference in temperature distribution. Thus, for example, as shown in FIG. 4A, some portions of the reflector 219 may contact the bonding surface 224A. In particular, when the temperature of the thermocompression bonding is high, the metal material of the reflector 219 thermally expands so much that the above contact is likely to occur due to deformation (refer to contact portions 227 indicated by dashed circles in FIG. 4A). Further, the portions of the reflector 219 contacting the bonding surface 224A may be adhered to the bonding surface 224A which is a transparent and flat surface.

FIG. 4B schematically illustrates a state of the reflector 219 according to the comparative example when the susceptor 217 is cooled after the thermocompression bonding process. When the thermocompression bonding process is completed and the cooling of the susceptor 217 is performed, the reflector 219 contracts and tries to return to its original shape. If some portions of the reflector 219 are adhered to the bonding surface 224A as shown in FIG. 4A before the reflector 219 starts contracting, a separating force acts on the adhered portions to separate them from the bonding surface 224A. As a result, as shown in FIG. 4B, the surface of the bonding surface 224A may peel off together with the adhered portions of the reflector 219. Thus, cracks may occur on the surface of the bonding surface 224A (refer to portion 228 where the cracks occur indicated by dashed circles in FIG. 4B). In addition, due to the adhesion during the thermocompression bonding process, the reflector 219 may not return to its original shape after cooling and may remain deformed.

When the cracks occur in the bonding surface 224A, not only transmission of the radiant heat radiated from the heater 218 is hindered and the radiant heat is reflected in a non-uniform manner, but also the susceptor 217 may be damaged. Specifically, for example, when the inside of the process chamber 201 is vacuum exhausted in the substrate processing described above, the stress is generated in the susceptor 217 by the pressure difference between the inner pressure of the reflector housing portion 226 and the inner pressure of the process chamber 201 or the pressure difference between the inner pressure of the heater housing portion 225 and the inner pressure of the process chamber 201, and the stress is concentrated in the cracks. As a result, the susceptor 217 may be damaged.

In order to address the above problems, it is possible to increase the depth of the reflector housing portion 226 so that the reflector 219 does not contact the bonding surface 224A in the thermocompression bonding process. However, when the depth of the reflector housing portion 226 is increased, the plurality of column portions 217B should be thickened or the number of the plurality of column portions 217B should be increased to secure the strength of the susceptor 217 to withstand the stress applied when vacuum exhausting the inside of the processing chamber 201 (that is, the strength to withstand vacuum). Thereby, the area that the reflector 219 can be installed is reduced. As a result, the area for reflecting the radiant heat from the heater 218 is decreased, and the efficiency or the uniformity of the heating by the heater 218 deteriorates. Therefore, it is desirable to address the above problems without increasing the depth of the reflector housing portion 226.

First Embodiment

Figure 5:
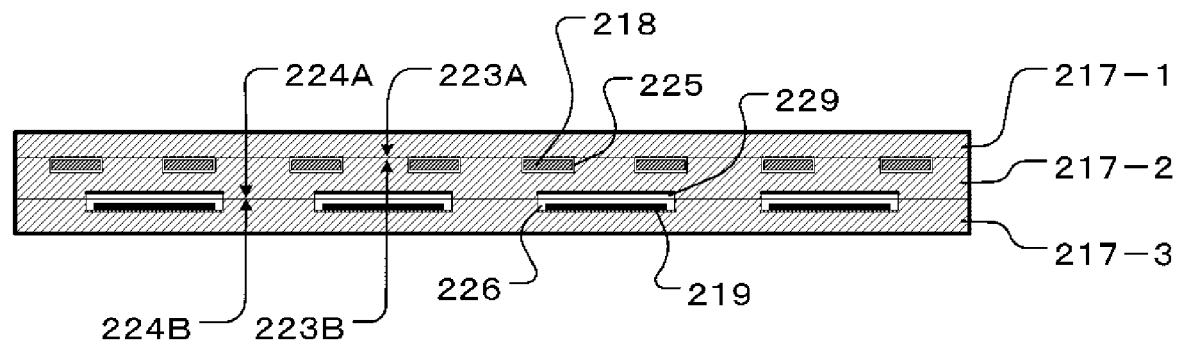
FIG. 5 schematically illustrates a vertical cross-section of the susceptor of the substrate processing apparatus according to the first embodiment.
Figure 6:
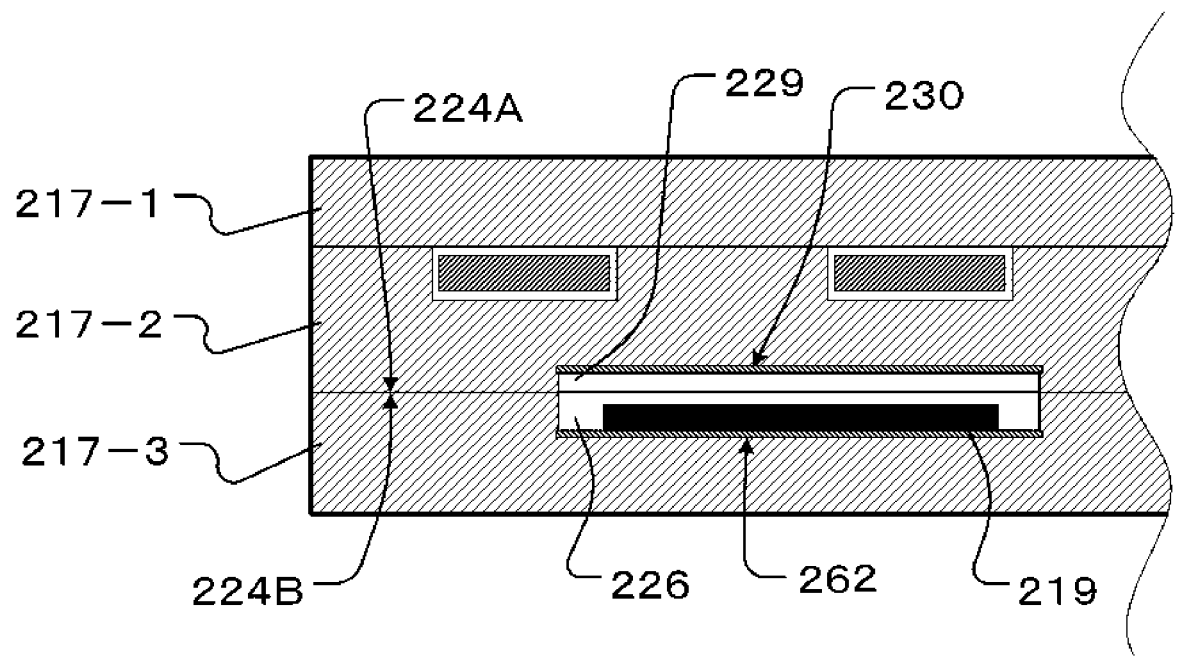
FIG. 6 is a partial enlarged view of the susceptor of the substrate processing apparatus according to the first embodiment.

Hereinafter, the first embodiment compared with the above-described comparative example will be described with reference to FIGS. 5, 6, 7A and 7B. FIG. 5 schematically illustrates a vertical cross-section of the susceptor 217 with the heater 218 and the reflector 219 embedded therein according to the first embodiment. Specifically, FIG. 5 schematically illustrates the vertical cross-section taken along the dot-and-dash line A-A' of the susceptor 217 shown in FIG. 2. FIG. 6 is a partial enlarged view of the susceptor 217 shown in FIG. 5. In the following description, the same components as those of the comparative example are denoted by the same reference numerals.

According to the first embodiment, a reflector facing recess 229 facing the reflector housing portion 226 is provided at the lower surface of the middle quartz plate 217-2 of the susceptor 217. A ceiling surface (the surface facing the reflector housing portion 226) of the reflector facing recess 229 is roughened to have a surface roughness equal to or greater than a predetermined value. In FIG. 6, the roughened ceiling surface is illustrated as a ceiling rough surface 230.

The surface roughness of the ceiling rough surface 230 is at least greater than the surface roughness of the transparent and flat surface of the bonding surface 224A. Therefore, as will be described later, as compared with the comparative example, it is possible to suppress the reflector 219 from adhering to the lower surface of the middle quartz plate 217-2 during the thermocompression bonding process. The surface roughness (hereinafter, also referred to as "Ra") of the bonding surface 224A is, for example, in the range of "Ra≤0.05 μm", that is, Ra of the bonding surface 224A is equal to or less than 0.05 μm, so that the bonding surface 224A is easy to adhere to the bonding surface 224B in the thermocompression bonding process. The surface roughness of the ceiling rough surface 230 according to the first embodiment is greater than Ra of the bonding surface 224A. In order to more reliably suppress the adhesion of the reflector 219 to the ceiling rough surface 230, preferably, the surface roughness of the ceiling rough surface 230 is, for example, in the range of "Ra≥0.1 µm", that is, Ra of the ceiling rough surface 230 is equal to or greater than 0.1 µm. For example, in the first embodiment, "Ra=about 2 µm", that is, Ra of the ceiling rough surface 230 is about 2 µm It is possible to form the reflector facing recess 229 by grinding the polished bonding surface 224A before the thermocompression bonding process. It is also possible to use a rough surface as the ceiling rough surface 230. The rough surface is generated on the inner wall surface of the reflector facing recess 229 by grinding the polished bonding surface 224A. In addition, the ceiling rough surface 230 is formed inside the reflector facing recess 229. Thus, even after the reflector facing recess 229 is formed, it is also possible to polish the lower surface of the middle quartz plate 217-2 with the reflector facing recess 229 to form the bonding surface 224A. The ceiling rough surface 230 may be formed by other roughening techniques including physical processing such as sandblasting or heat treatment and chemical processing using hydrogen fluoride.

In addition, a bottom surface (the surface on which the reflector 219 is placed) of the reflector housing portion 226 may be roughened having a surface roughness equal to or greater than a predetermined value. In FIG. 6, the roughened bottom surface is illustrated as a bottom rough surface 262. By providing the bottom rough surface 262, it is possible to suppress the reflector 219 from adhering to the bottom surface of the reflector housing portion 226 during the thermocompression bonding. The surface roughness of the bottom rough surface 262 may be the same as that of the ceiling rough surface 230 or may be appropriately selected within the range of the surface roughness of the ceiling rough surface 230 described above. Similar to the reflector facing recess 229, it is possible to form the reflector housing portion 226 by grinding the upper surface of the lower quartz plate 217-3 before the thermocompression bonding process. It is also possible to use a rough surface as the bottom rough surface 262. The rough surface is generated on the inner wall surface of the reflector housing portion 226 by grinding the upper surface of the lower quartz plate 217-3. The polishing process for forming the bonding surface 224B may be performed before or after forming the reflector housing portion 226. Similar to the ceiling rough surface 230, the bottom rough surface 262 may be formed by other roughening techniques.

Figure 7A:
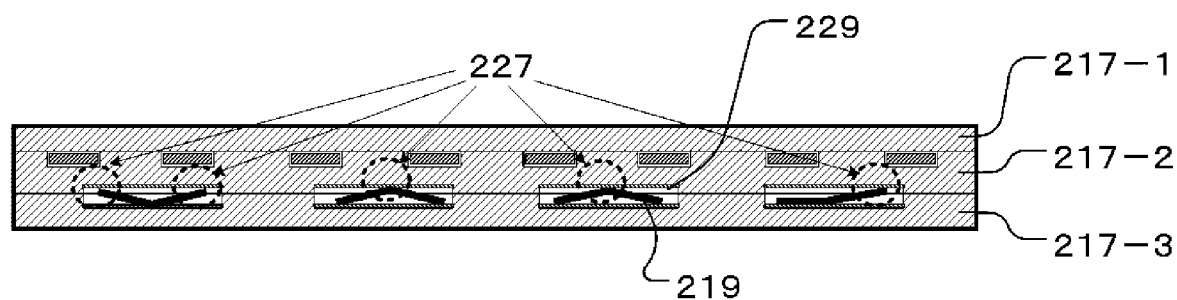
FIGS. 7A and 7B schematically illustrate the vertical cross-section of the susceptor according to the first embodiment.
Figure 7B:
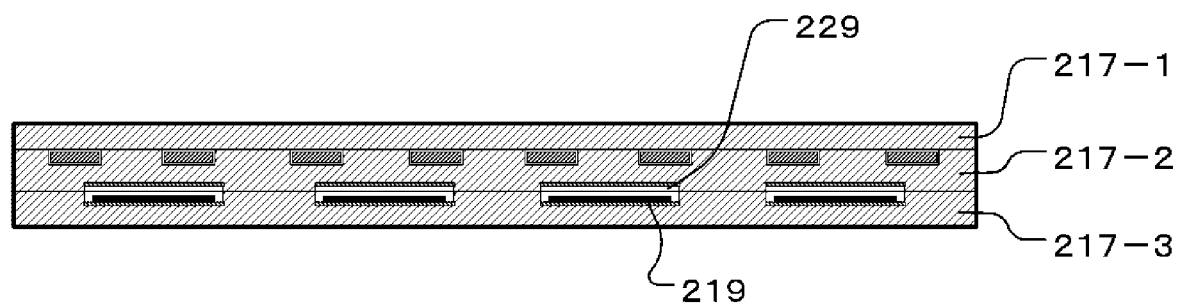

FIGS. 7A and 7B schematically illustrate the vertical cross-section of the susceptor 219 with the heater 218 and the reflector 219 embedded therein according to the first embodiment. FIG. 7A schematically illustrates a state of the reflector 219 during the thermocompression bonding process, and FIG. 7B schematically illustrates a state of the reflector 219 when the susceptor 217 is cooled after the thermocompression bonding process. Even in the first embodiment, the reflector 219 heated by the thermocompression bonding process is deformed by thermal expansion, and some portions of the reflector 219 may contact the ceiling rough surface 230 as shown in the contact portions 227 in FIG. 7A. However, according to the first embodiment, even if the deformed reflector 219 contacts with the lower surface of the middle quartz plate 217-2, the contact portions 227 are located on a roughened surface (i.e., ceiling rough surface 230). This makes it possible to suppress the reflector 219 from adhering to the ceiling rough surface 230 compared with the comparative example where the reflector 219 comes into contact with the bonding surface 224A which is transparent and flat for the thermocompression bonding process. Therefore, as shown in FIG. 7B, even if the reflector 219 returns to its original shape after cooling, it is possible to prevent the reflector 219 from peeling or cracking the lower surface of the middle quartz plate 217-2 due to the adhering of the reflector 219. It is also possible to reduce the problem that the reflector 219 can not return to its original shape by adhesion even after cooling.

In the above description, the first embodiment is described based on an example that the reflector 219 is deformed in the thermocompression bonding process of the susceptor 217. However, when there is a possibility that the reflector 219 is deformed by being heated at a high temperature other than the thermocompression bonding process, the first embodiment can be applied. When the susceptor 217 is configured according to the first embodiment, it is possible to suppress the occurrence of the damage such as the cracks.

In addition, the bottom rough surface 262 on which the reflector 219 is placed is also roughened according to the first embodiment. Thus, it is possible to prevent the reflector 219 from adhering to the bottom surface of the reflector housing portion 226 during the thermocompression bonding process. It is also possible to suppress surface peeling that may occur at the bottom surface of the reflector housing portion 226 after cooling and reduce failure of the reflector 219 to return to its original shape from the deformed state.

According to the first embodiment, even if the deformed reflector 219 contacts with the lower surface of the middle quartz plate 217-2, it is possible to suppress the reflector 219 from adhering to the lower surface of the middle quartz plate 217-2. Thus, it is unnecessary to increase the depth of the reflector housing portion 226 for preventing the reflector 219 from contacting the lower surface of the middle quartz plate 217-2. Therefore, it is possible to reduce the depth of the reflector housing portion 226 compared with the comparative example. It is also possible to improve the strength to withstand vacuum and to make the susceptor 217 having a thickness thinner than that of the comparative example. It is preferable to reduce the depth of the reflector facing recess 229 from the viewpoint of resistance to vacuum. According to the first embodiment, for example, the depth of the reflector facing recess 229 ranges from 0.2 mm to 0.4 mm, in consideration of machining accuracy.

Second Embodiment

Figure 8:
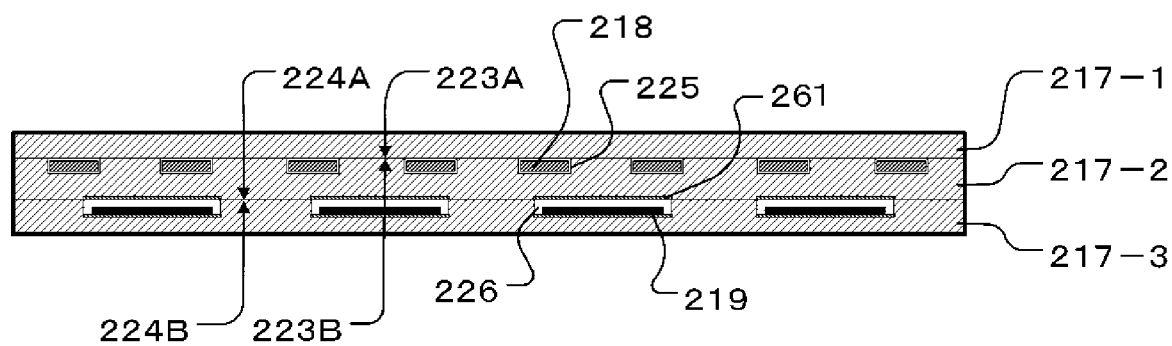
Figure 9:
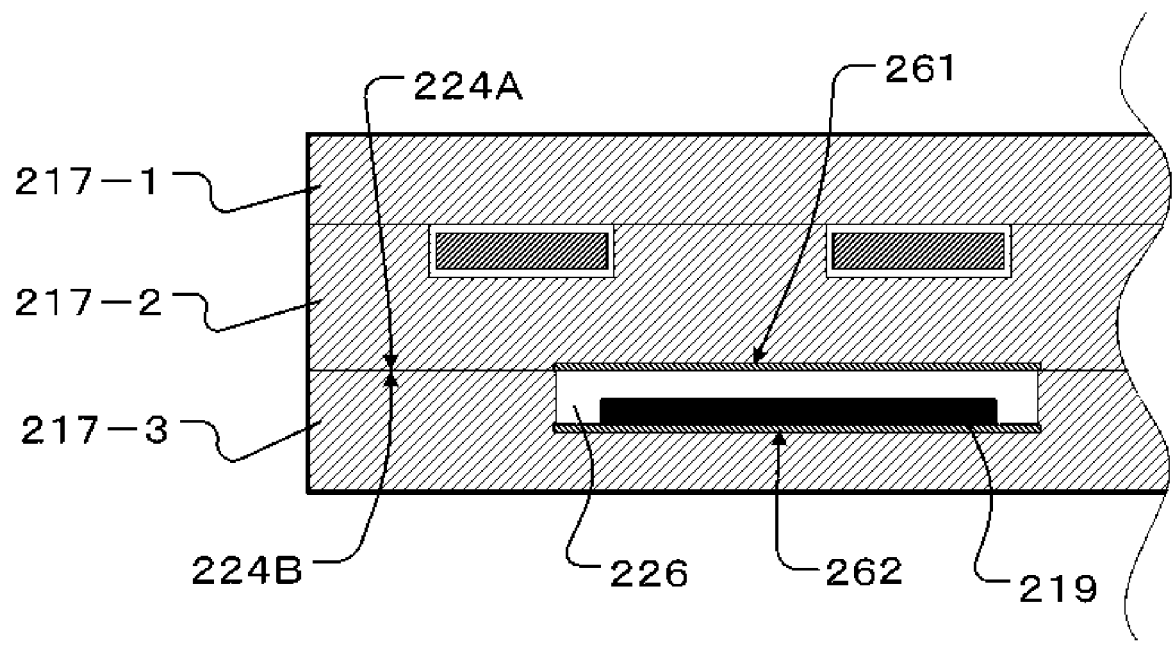
FIG. 9 is a partial enlarged view of the susceptor of the substrate processing apparatus according to the second embodiment.

Hereinafter, a second embodiment will be described with reference to FIGS. 8 and 9. FIG. 8 schematically illustrates a vertical cross-section of the susceptor 219 with the heater 218 and the reflector 219 embedded therein according to the second embodiment. Specifically, FIG. 8 schematically illustrates the vertical cross-section taken along the dot-and-dash line A-A' of the susceptor 217 shown in FIG. 2. FIG. 9 is a partial enlarged view of the susceptor 217 shown in FIG. 8. In the following description, the same components as those of the comparative example or the first embodiment are denoted by the same reference numerals.

The second embodiment is a modified example of the first embodiment described above. According to the second embodiment, the reflector facing recess 229 of the first embodiment is not provided. According to the second embodiment, portions of the lower surface of the middle quartz plate 217-2 facing the reflector housing portion 226 are roughened to have a surface roughness equal to or greater than a predetermined value. In FIG. 9, the lower surface of the roughened middle quartz plate 217-2 is illustrated as an upper rough surface 261.

The surface roughness of the upper rough surface 261 is similar to that of the ceiling rough surface 230 in the first embodiment. That is, the surface roughness of the upper rough surface 261 is at least greater than the surface roughness of the transparent and flat surface of the bonding surface 224A. Therefore, it is possible to suppress the reflector 219 from adhering to the lower surface of the middle quartz plate 217-2 during the thermocompression bonding process. In order to more reliably suppress the adhesion of the reflector 219 to the lower surface of the middle quartz plate 217-2, preferably, the surface roughness of the upper rough surface 261 is, for example, in the range of "Ra≥0.1 μm", that is, Ra of the upper rough surface 261 is equal to or greater than 0.1 μm.

As described above, according to the second embodiment, the reflector facing recess 229 of the first embodiment is not provided. Therefore, in order to form the upper rough surface 261, it is preferable to use a roughening technique capable of performing a partial surface roughening to roughen the portions of the polished bonding surface 224A facing the reflector housing portion 226 before the thermocompression bonding process. The roughening technique capable of performing the partial surface roughening includes, for example, physical processing such as sandblasting or heat treatment and chemical processing using hydrogen fluoride. However, other techniques may be used. For example, it is possible to form the bonding surface 224A by polishing the lower surface of the middle quartz plate 217-2 without polishing the upper rough surface 261 formed in advance.

As described above, according to the second embodiment, the reflector facing recess 229 in the first embodiment is not provided. Therefore, it is possible to improve the strength to withstand vacuum and to make the susceptor 217 having a thickness thinner than that of the first embodiment.

While the embodiments described above exemplify a modification process such as an oxidation process and a nitridation process to the silicon film, the above-described technique is not limited thereto. The above-described technique may also be applied to other processes. For example, the above-described technique may be applied to an apparatus configured to perform a substrate processing such as a film-forming process by alternately supplying a source gas and a reactive gas, a heat treatment process, an annealing process, an ashing process and an etching process.

According to the technique described herein, it is possible to prevent the susceptor made of quartz from being damaged by contacting the reflector deformed by thermal expansion.

What is claimed is:

1. A substrate support comprising:
   an upper susceptor made of quartz;
   a lower susceptor made of quartz; and
   a reflector reflecting heat and made of a metal in a planar shape,
   wherein a lower surface of the upper susceptor is bonded with an upper surface of the lower susceptor such that the reflector is interposed therebetween, a first recess accommodating the reflector is provided at the upper surface of the lower susceptor, and the lower surface of the upper susceptor comprises a roughened ceiling surface facing the first recess.

2. The substrate support of claim 1, wherein a heating element radiating heat is provided in the upper susceptor, and the reflector is configured to reflect the heat radiated from the heating element.

3. The substrate support of claim 2, wherein the upper susceptor comprises:
   an upper plate whereon a substrate is placed;
   a lower plate bonded to the lower susceptor; and
   the heating element provided between the upper plate and the lower plate.

4. The substrate support of claim 1, wherein the upper susceptor and the lower susceptor are bonded to each other by bonding a polished portion of the lower surface of the upper susceptor with a polished portion of the upper surface of the lower susceptor by a thermocompression bonding process, and a surface roughness of the roughened ceiling surface of the upper susceptor facing the first recess is greater than a surface roughness of the polished portion of the lower surface of the upper susceptor.

5. The substrate support of claim 1, wherein a surface roughness of the roughened ceiling surface of the upper susceptor facing the first recess is equal to or greater than 0.1 μm.

6. The substrate support of claim 1, wherein a second recess is provided at a portion of the lower surface of the upper susceptor facing the first recess, and the roughened ceiling surface is provided on the second recess.

7. The substrate support of claim 6, wherein the second recess and the roughened ceiling surface of the second recess facing the first recess are formed by grinding.

8. The substrate support of claim 1, wherein a bottom surface of the first recess is roughened.

9. The substrate support of claim 8, wherein the upper susceptor and the lower susceptor are bonded to each other by bonding a polished portion of the lower surface of the upper susceptor with a polished portion of the upper surface of the lower susceptor by a thermocompression bonding process, and a surface roughness of the bottom surface of the first recess is greater than a surface roughness of the polished portion of the upper surface of the lower susceptor.

10. The substrate support of claim 8, wherein the first recess and the bottom surface of the first recess are formed by grinding.

11. The substrate support of claim 8, wherein a surface roughness of the roughened ceiling surface of the upper susceptor facing the first recess is substantially equal to a surface roughness of the bottom surface of the first recess.

12. The substrate support of claim 1, wherein the roughened ceiling surface of the upper susceptor facing the first recess and a bonded portion of the lower surface of the upper susceptor whereat the upper susceptor is bonded to the lower susceptor are aligned on a same plane.

13. The substrate support of claim 12, wherein the upper susceptor and the lower susceptor are bonded to each other by bonding a polished portion of the lower surface of the upper susceptor with a polished portion of the upper surface of the lower susceptor by a thermocompression bonding process, and a surface roughness of the roughened ceiling surface of the upper susceptor facing the first recess is greater than a surface roughness of the polished portion of the lower surface of the upper susceptor.

14. The substrate support of claim 12, wherein a surface roughness of the roughened ceiling surface of the upper susceptor facing the first recess is equal to or greater than 0.1 μm.

15. The substrate support of claim 1, wherein the reflector is made of molybdenum or tungsten.

16. A substrate processing apparatus comprising a substrate support, the substrate support comprising:
   an upper susceptor made of quartz;
   a heating element radiating heat and provided in the upper susceptor;
   a lower susceptor made of quartz; and
   a reflector reflecting the heat from the heating element and made of a metal in a planar shape, wherein a lower surface of the upper susceptor is bonded with an upper surface of the lower susceptor such that the reflector is interposed therebetween, a first recess accommodating the reflector is provided at the upper surface of the lower susceptor, and the lower surface of the upper susceptor comprises a roughened ceiling surface facing the first recess.

\* \* \* \* \*